United States Patent [19]

Serev et al.

[11] Patent Number: 4,511,884

[45] Date of Patent: Apr. 16, 1985

[54] PROGRAMMABLE LIMIT SWITCH SYSTEM USING A RESOLVER-TO-DIGITAL ANGLE CONVERTER

[75] Inventors: Peter G. Serev, Woodbury; Roger M. Bogin, Washington Depot, both of Conn.

[73] Assignee: C & A Products, Inc., Washington Depot, Conn.

[21] Appl. No.: 440,421

[22] Filed: Nov. 9, 1982

[51] Int. Cl.³ .......................................... H03K 13/02
[52] U.S. Cl. .......................... 340/347 SY; 318/660; 364/603; 364/200; 364/300; 364/900
[58] Field of Search ............. 340/347 SY, 347 M; 318/660, 661; 364/603, 200, 300, 900

[56] References Cited

U.S. PATENT DOCUMENTS 3,505,669  4/1970  Welch ..................... 340/347 M X
4,375,636  3/1983  Stack et al. ................ 340/347 SY
4,390,865  6/1983  Lauro ....................... 340/347 SY

OTHER PUBLICATIONS

Klein, Angle to Digital Conversion System, Instruments & Control Systems, vol. 40, No. 2, 2/1967, pp. 126-130.
Schmid, H., Synchro-To-Digital Converters, Electronic Design, 6, Mar. 15, 1970, pp. 178-185, 7, Apr. 1, 1970, pp. 50-58, 8, Apr. 12, 1970, pp. 76-79, 9, Apr. 26, 1970, pp. 72-77 and 10, May 10, 1970, pp. 98-103.
Manufacturer's Brochures: Mark VII Micro-Computer Programmable Limit Switches, 1982, C & A Products, Inc.
Microprocessor-Based Limit Programmer, Sequential Information Systems, Inc.
Microcomputer PLS, Sep. 1980, Gemco Electric.

Primary Examiner—T. J. Sloyan
Attorney, Agent, or Firm—Cooper, Dunham, Clark, Griffin & Moran

[57] ABSTRACT

Disclosed is a microcomputer controlled system in which the resolver reference voltage is generated through microcomputer interrupts and the analog-to-digital conversion of the resolver outputs ratio is also timed by the microcomputer to match peaks of the resolver reference voltage. To improve accuracy and resolution, the resolver outputs are synchronously full-wave rectified to the polarity of the amplitude modulation voltage. The microcomputer uses the digital resolver shaft angle to control programmable limit switches.

4 Claims, 6 Drawing Figures

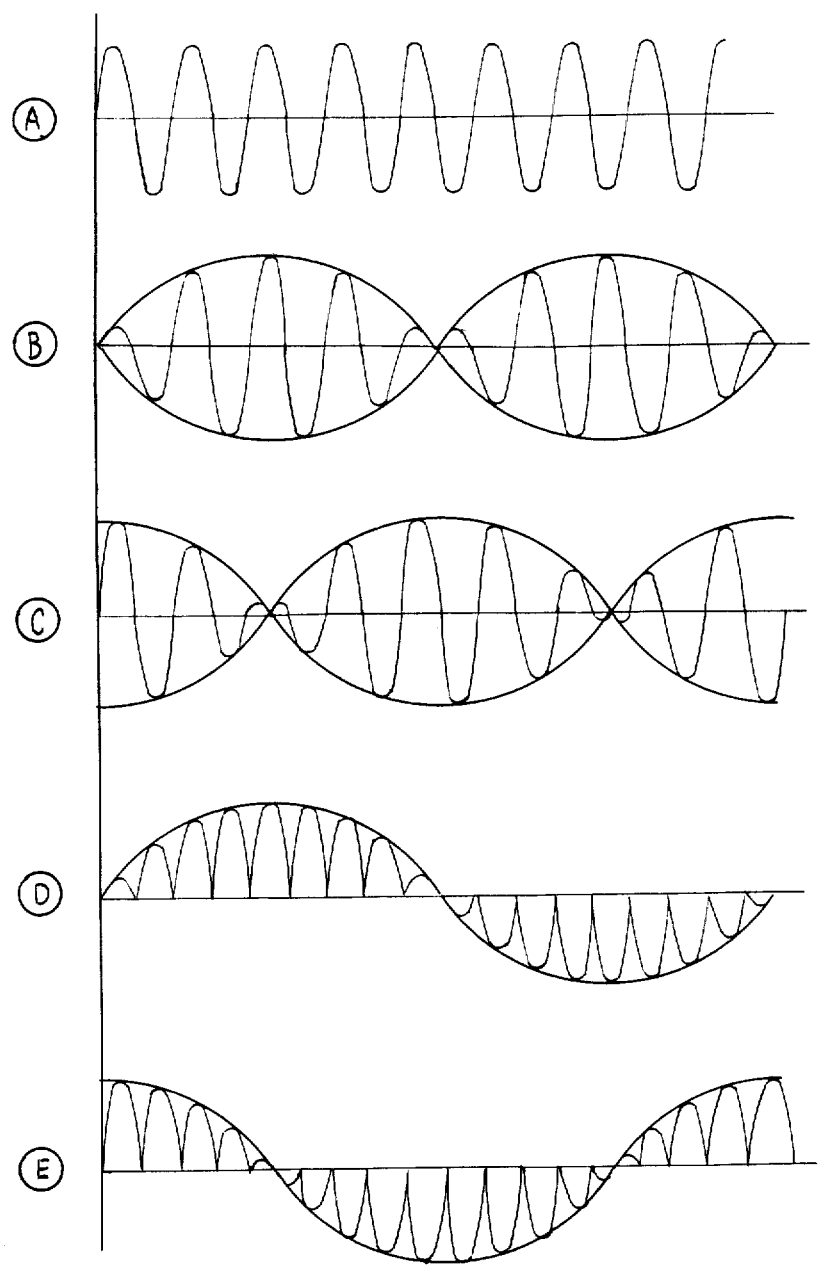

PROGRAMMABLE LIMIT SWITCH SYSTEM USING A RESOLVER-TO-DIGITAL ANGLE CONVERTER

BACKGROUND AND SUMMARY OF THE INVENTION

The invention is in the general fields of sensing the angle of a shaft and of controlling equipment on the basis of shaft angle position, and is more specifically in the field of programmable limit switches using resolver (synchro)-to-digital angle conversion.

The measurement of shaft angle is a common requirement in a variety of equipment such as machine and process control systems, because the position of a shaft can be used to activate or deactivate other elements of the system, and/or the rotational speed or acceleration of the shaft can be used to control other events. Many different forms of shaft angle transducers have been developed, such as potentiometers, brush encoders, optical encoders, synchros, and the special form of a synchro called a resolver. Synchros and resolvers are of particular interest because of their relatively high reliability and functional stability, as they do not depend for signal integrity on moving electrical contacts, do not exhibit appreciable aging or wear, do not drift significantly with time, and temperature changes have negligible effect on their performance. Synchros have a rotor connectable to the shaft of interest and rotatable inside a stator. The rotor typically carries one or three windings, and the stator carries three windings connected 120° apart. Typically the rotor winding is excited with an a-c voltage called the reference voltage, and the voltage induced in any stator winding is proportional to the cosine of the angle between the rotor coil axis and the stator coil axis. The voltage induced across any pair of stator windings is the sum or difference, depending on the phase, of the voltages across the two windings. A resolver is a special form of a synchro, and typically has a single rotor winding and a pair of stator windings which are spatially at 90° to each other instead of 120° as in the case of synchros generally. The two-wire rotor terminals accept an a-c reference voltage, and the pair of two-wire output terminals, connected to isolated stator windings, produce a pair of voltages which are at the reference voltage frequency but have amplitudes proportional respectively to the sine and cosine of the spatially angular position of the shaft. The ratio of the two outputs is an accurate measure of the tangent of the shaft angle, and this ratio can be digitized and used as an input to a programmable limit switch system which activates and deactivates limit switches to control process steps or equipment elements. Such programmable limit switches, because of their reliability and easy adaptability to new control functions, are gradually replacing the older type of limit switch systems which rely on cams affixed to the shaft of interest and mechanically coupled to limit switches or other electromechanical elements.

Several schemes for converting the outputs of synchros and resolvers to a digital signal are discussed in a 5-part article: Schmid, H., Synchro-To-Digital Converters, Electronic Design, 6, Mar. 15, 1970, pp. 178–185, 7, Apr. 1, 1970, pp. 50–58, 8, Apr. 12, 1970, pp. 76–79, 9, Apr. 26, 1970, pp. 72–77 and 10, May 10, 1970, pp. 98–103. A relevant proposal is discussed in the part in Electronic Design, 8, and involves connecting the outputs of a resolver selected for the proper octant, to the signal and reference inputs of a conventional a/d converter to produce an output digital signal proportional to the tangent of the shaft angle and, if needed, recovering the angular information from the tangent signal. Octant selector proposals are discussed in the part in Electronic Design, 6.

Programmable limit switches use the digitized angle signal from a resolver (or synchro)-to-digital converter for control functions such as activating and deactivating limit switches depending on the shaft angle. The same digitized angle signal can be used for motion detection and tachometer functions, or for other control functions. Examples are referred to in manufacturer's brochures such as Mark VII Micro-Computer Programmable Limit Switches, 1982, C&A Products, Inc.; Microprocessor-Based Limit Programmer, undated, Sequential Information Systems, Inc.; Microcomputer PLS, September 1980, Gemco Electric.

Accuracy, reliability and low cost are some of the desirable characteristics of both resolver-to-digital converters and programmable limit switches, but are not believed to be successfully combined in the known prior art systems. Accordingly, this invention is directed to achieving this desirable combination of features in a particularly advantageous manner.

An exemplary and nonlimiting embodiment of this invention uses a resolver-to-digital converter in which the reference voltage for exciting the resolver input is derived from the status of a reference bit complemented periodically by a microprocessor programmed to generate periodic interrupts. The same microprocessor interrupts control the timing of the analog-to-digital conversion of the resolver outputs to ensure that the a/d cycle is in the most advantageous phase relationship with the reference voltage which excites the resolver rotor and is induced into the resolver stator windings. This improves accuracy as compared to known systems in this field, and reduces cost because it eliminates the requirement for separate reference voltage generators and peak detection circuits. In addition, the outputs of the resolver are subjected to fullwave rectification synchronized with the reference voltage to thereby substantially increase the average voltage level of the resolver outputs as compared with the known prior art, to thereby increase reliability and improve noise immunity.

Briefly, an exemplary and nonlimiting embodiment of the invention involves programming a microcomputer to generate periodic interrupts and to complement an output bit at each, and using the changes in the state of the output bit to generate a reference a-c voltage for exciting the rotor winding of the resolver. In response, the resolver provides a first output which is at the frequency of the reference voltage but is amplitude-modulated as a function of the sine of the shaft angle, and a second output which is similarly modulated as a function of the cosine of that angle. These outputs are fullwave rectified to the polarities of the sine and cosine envelopes in synchronism with the status changes in the output bit of the microcomputer, and the resulting enhanced voltage signals, after going through low pass filters, are used to find the first two bits determining the octant of the shaft angle, while their absolute values are compared with each other to find the third bit defining the octant, and to serve as inputs to a conversion cycle for finding a binary code representation of the tangent of the shaft angle within the current octant. This conversion cycle is short as compared to the cycle of the reference voltage and is synchronized with the output bit status changes such that it takes place in a selected phase relationship with the reference voltage, e.g. just before the positive peaks thereof. The 3-bit octant designator and the binary tangent representation are processed, e.g. through look-up tables, to give an absolute value for the current shaft angle. This absolute value can be offset and/or scaled as desired, and the result is compared with the from and to settings of limit switches to provide control signals commanding the activation or deactivation of the relevant limit switches in the relevant channels.

BRIEF DESCRIPTION OF THE DRAWINGS

FIGS. 3a and 3b illustrate waveforms useful in describing the operation of the systems shown in FIGS. 1 and 2.

DETAILED DESCRIPTION

Figure 1:
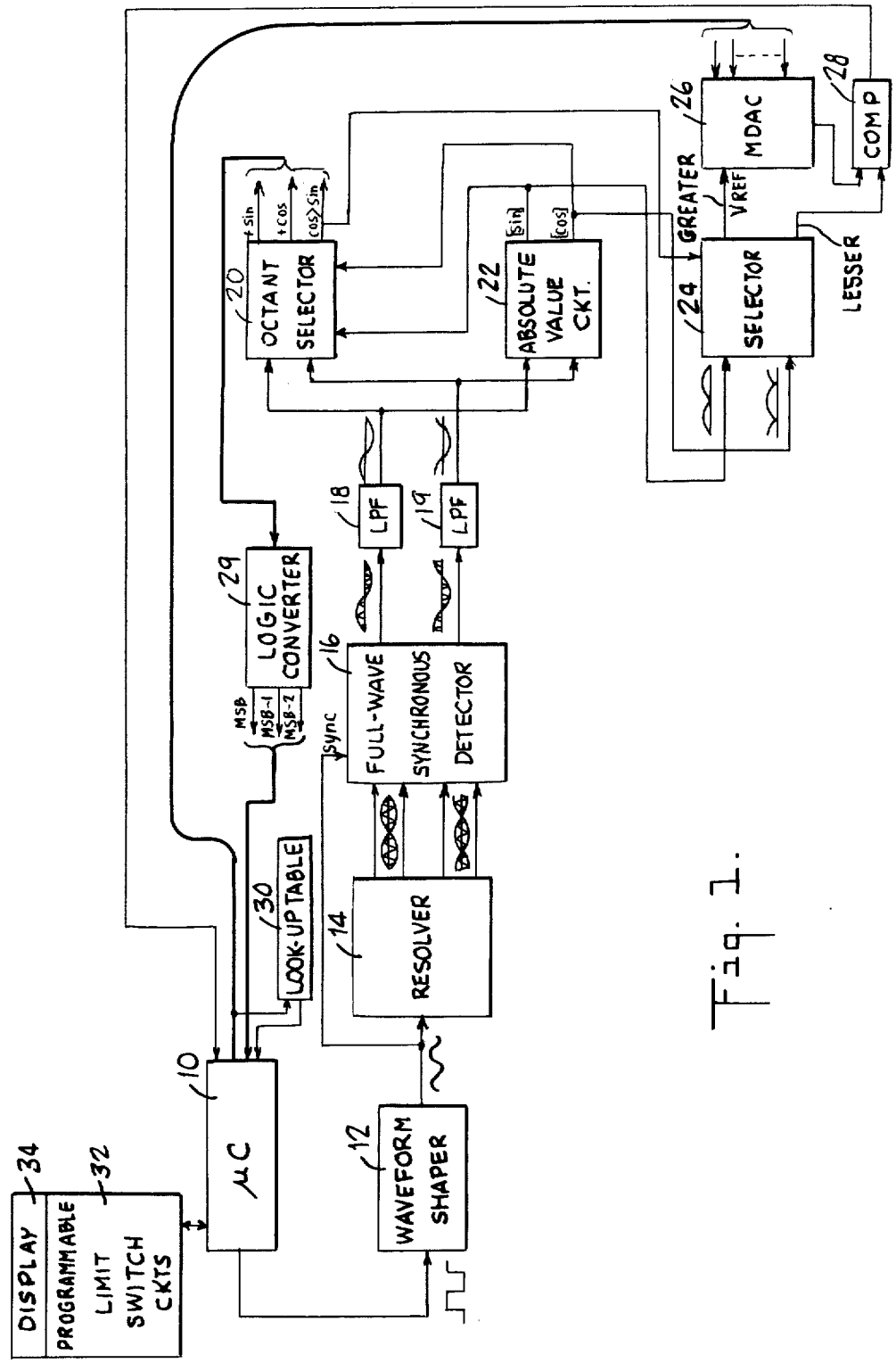
FIG. 1 is a block diagram illustrating the major elements of a resolver-to-digital angle converter embodying the invention.

Referring to FIG. 1, an exemplary and nonlimiting embodiment of the invention includes a resolver-to-digital angle converter under the control of a microcomputer generally indicated at 10, which can be an IC containing all of the necessary arithmetic, logic and memory circuits, or can comprise two or more interconnected IC's and supporting circuits which collectively provide the necessary functions. Microcomputer 10 is programmed in a conventional manner to provide a highest priority interrupt at a selected time interval, and to complement a reference frequency bit at every interrupt. For example, it can be programmed to generate an interrupt every 125 microseconds, and thus complement the reference bit every 125 microseconds and provide to a waveform shaper 12 an output which is substantially a squarewave having a 250 microseconds cycle (4 KHz). Waveform shaper 12 converts this squarewave input to an output which is at the same frequency but is substantially sinusoidal, and is used as the reference voltage signal exciting the rotor winding of a resolver 14. In response, resolver 14 provides a first two-wire output which is at the frequency of the reference voltage but is amplitude modulated as a function of the sine of the angle between the resolver rotor and stator windings, and a second two-wire output which again is the frequency of the reference voltage but is amplitude modulated as a function of the cosine of the same angle. The ratio of these outputs corresponds to the tangent of the spatial shaft angle, and the remainder of the system shown in FIG. 1 serves to extract the angle in digital form.

In order to improve the available signal as compared to the known prior art in this field, the outputs of resolver 14 are supplied to a fullwave synchronous detector 16 synchronized by the output of waveform shaper 12 to provide two outputs: the first output of detector 16 is the first output of the resolver fullwave rectified to the polarity of the sine amplitude modulation, and the second output of detector 16 is the second output of resolver 14 fullwave rectified to the polarity of the cosine amplitude modulation. To retain the amplitude modulation signal while substantially eliminating the carrier at the reference voltage frequency, the outputs of detector 16 are supplied to respective low pass filters 18 and 19, whose outputs approximate the respective amplitude modulation voltages corresponding to the sine and cosine of the spatial angle of the resolver shaft. At this time, the polarity of the sine voltage indicates if the shaft angle is the first or second half of a full revolution, the polarity of the cosine voltage indicates whether the shaft angle is in the first or second half of a 180° segment, and a comparison of the absolute values of the sine and cosine voltages can indicate if the shaft angle is in the first or second half of a 90° segment. Thus, these three tests can determine the octant in which the shaft angle currently being measured happens to be. For this purpose, the outputs of filters 18 and 19 are supplied to an octant selector 20, which tests the polarity of the sine output of filter 18 and provides a logic one for the first four octants and a logic zero for the rest, tests the polarity of the cosine output of filter 19 and provides a logic one for the first two octants, logic zero for the next four and a logic one for the last two, and tests if the absolute value of the cosine output is greater than that of the sine output (said absolute values being supplied by a circuit 22) and provides a logic zero for the first, fourth, fifth and eighth octants and logic one for the others. The outputs of octant selector 20 are three bits which identify the octant of the shaft angle, and are supplied to a logic converter 29 where they are converted to a pure binary code representation of the three most significant bits of the resolver shaft angle. For clarity, logic converter 29 is shown as a separate element, but in the preferred embodiment it is actually a part of microcomputer 10.

In order to start the process of finding the less significant bits of the shaft angle, the outputs of the same filters 18 and 19, after being converted to their absolute values by circuit 22, are supplied to a selector 24 which has two outputs and is controlled by the third octant bit from selector 20. The first output of selector 24 for any octant is the greater of its two inputs, and the second for any octant is the lesser of its two inputs. For the actual a/d conversion, the first output of selector 24 is supplied as reference voltage to a multiplying digital-to-analog converter 26, whose other input is a digital word (in this example 8 bits) supplied from microcomputer 10. The output of converter 26 then serves as one of the inputs of a comparator 28 whose other input is the lesser output of selector 24, and whose output goes to microcomputer 10. The combination of microcomputer 10, converter 26 and comparator 28 then operates in a sequence in which microcomputer 10 supplies to converter 26 an 8-bit digital word in binary code which is successively approximated such that the word when multiplied with the reference input of converter would provide at its output an analog signal which is as close as possible to the second (lesser) output of selector 24. In the particular embodiment discussed here, this sequence of finding the appropriate values of the 8 bits (in pure binary code) through this operation of converter 26 takes about 32 microseconds, and is timed by microcomputer 10 such that it takes place in the same phase relationship to the sinusoidal reference voltage exciting the rotor winding of the resolver. Specifically, the phase relationship is such that the 32 microsecond conversion cycle takes place just before the peak of the reference sinusoidal wave when the time-shifts due to the various components between the resolver input and converter 26 have been taken into account. Thus, because in accordance with the invention both the sinusoidal reference voltage applied to resolver 14 and the timing of the 32 microsecond conversion cycle are controlled by the same events in microprocessor 10, excellent synchronization can be achieved. Moreover, the need for separate resolver reference voltage generator and peak detection circuit is eliminated.

The 8-bit word set at the conclusion of the 32 microsecond conversion cycle of converter 26, which is the tangent of the shaft angle in binary code for the octant of interest, is supplied to a look-up table 30 whose output is an 8-bit word in pure binary code representing the spatial angle of the resolver shaft at the time. This output of table 30 is used by microcomputer 10 which, in response, adds the 3 bits from logic converter 29 to the 8 bits from table 30 to get an 11-bit binary word for the shaft angle, and exercises suitable control over programmable limit switches circuits 32 and display 34. For example, microcomputer 10 can format the 11-bit binary output of table 30 into a averaged 10-bit digital signal in binary code by averaging the two most recent conversions, and can use the resulting 10-bit binary signal to multiply any desired scale factor and can convert the 10 most significant bits of the resulting pure binary digital signal to BCD format supplied to circuits 32 and/or to display 34 showing the shaft angle in, e.g., degrees in decimal code. Again, while table 30 has been shown for clarity as a separate element, in the preferred embodiment it is a part of microcomputer 10.

Figure 2:
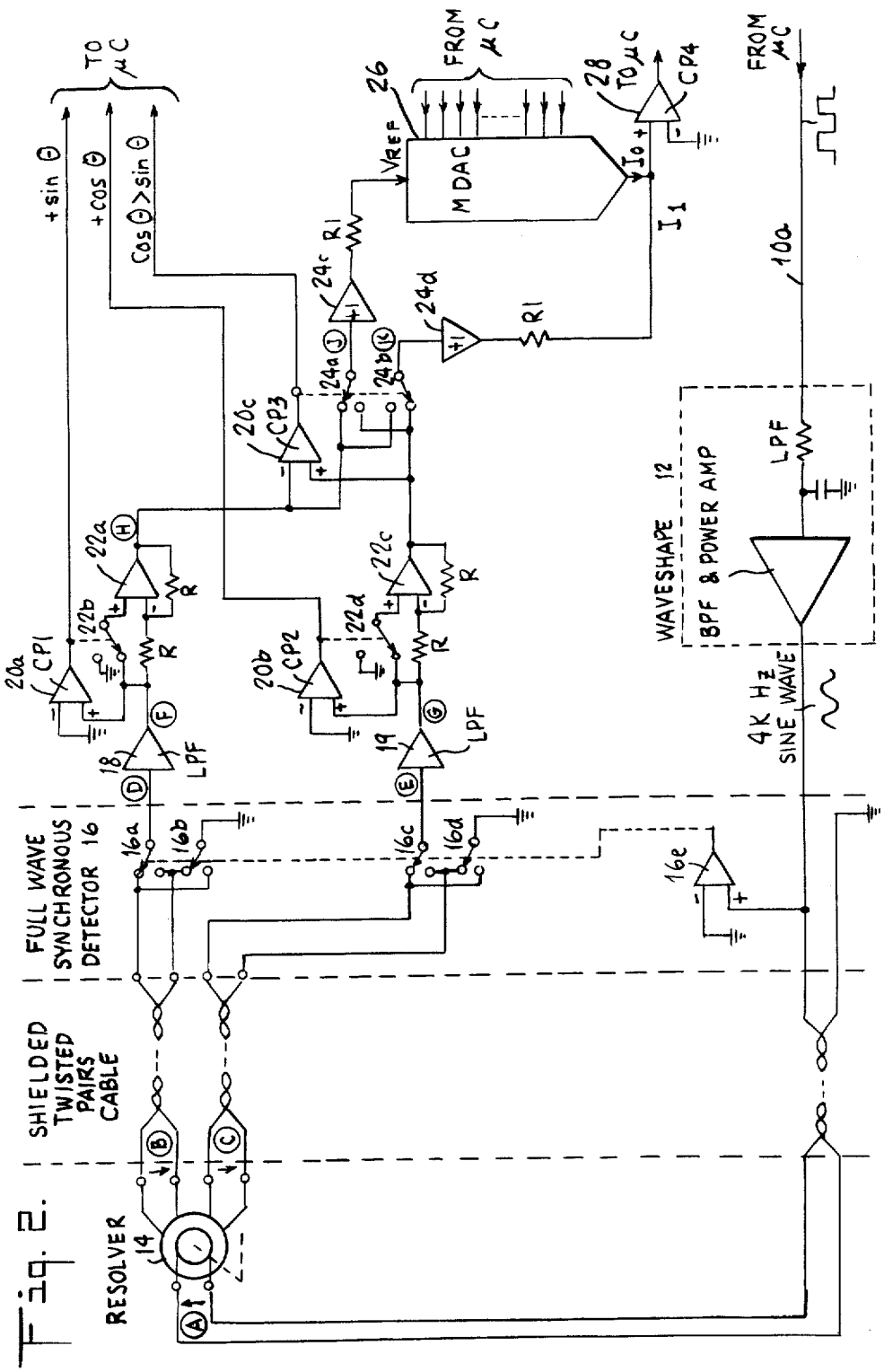
FIG. 2 is a more detailed diagram of parts of the system shown in FIG. 1.

Referring to FIG. 2, where like elements are identified by the same reference numbers as in FIG. 1, waveform shaper 12 receives the squarewave output from microcomputer 10 over line 10a, and uses a resistor-capacitor low pass filter and a band pass filter and power amplifier converted into a substantially sinusoidal output at 4 KHz. This sinusoidal waveforem is sent to the rotor winding or resolver 14 by means of a shielded twisted pair cable to serve as resolver reference voltage having the general waveform illustrated at A in FIG. 3a. The output of one of the stator windings of resolver 14 is a voltage at the reference frequency, amplitude modulated as a function of the sine of the spatial angle between the resolver rotor and stator, and has the waveform illustrated at B in FIG. 3a for a complete revolution of the rotor. The output of the other stator winding is also at the reference voltage frequency, but is modulated as a function of the cosine of the same angle, and has the waveform illustrated at C in FIG. 3a, again for a complete revolution of the rotor. Waveforms B and C are transmitted, via respective shielded, twisted pair cables, to fullwave synchronous detector 16, which in this example comprises four CMOS transmission gates (analog CMOS switches) 16a–d and a comparator 16e whose positive input is connected to the sine wave output of waveform shaper 12 and whose negative output is connected to ground. When the positive input of comparator 16e is at positive polarity, switches 16a through 16b are in their shown positions, but when the positive input of 16e is at negative polarity, they are in the other position. As a result, switch 16a outputs the waveform shown at D in FIG. 3a, and switch 16c outputs the waveform shown at E in FIG. 3a. The benefit of this is that the average voltage of the outputs of detector 16 is about double what it would have been had the circuit used the known prior art techniques of halfwave rectification at this point. Thus, everything else being the same, the circuit embodying the invention works with a higher input voltage to the remainder of the circuitry, with attendant benefits to higher resolution, reliability and noise immunity. The sine output of switch 16a is treated by low pass filter 18, whose output has the waveform illustrated at F in FIG. 3b, and the cosine output of detector 16 is treated by low pass filter 19, whose output has the waveform illustrated at G in FIG. 3b.

Octant selector 20 includes a comparator 20a, whose positive input is the output of filter 18 and whose negative input is grounded. As a result, the output of comparator 20a is high for the first four octants (logical one), and low for the last four octants of the shaft angle (logical zero). Its output can therefore serve as the most significant bit of the 3 bits designating the octant of the shaft angle. Similarly, the next most significant bit for the octant is determined by the output of comparator 20b, whose positive input is the output of filter 19 and whose negative input is grounded. The output of comparator 20b is therefore high for the first two octants (logical one), low for the next four octants (logical zero) and high for the remaining two octants of the shaft angle, and can thus serve for the stated purpose. In order to find the third most significant bit for the octant the absolute values of the sine and cosine outputs of filters 18 and 19 are needed. To this end, the output of filter 18 is supplied to the negative input of an operational amplifier 22a whose positive input comes from a switch 22b controlled by the output of comparator 20a which, as noted earlier, is high for the first four octants and low for the last four. As a result, the output of amplifier 22a is equal to its input for the first four octants, but is equal to the inverse of its input for the last four, and has the waveform H illustrated at FIG. 3b. Similarly, the output of filter 19 is supplied to the negative input of an operational amplifier 22c whose positive input comes from a switch controlled by comparator 22b which, as earlier noted, is high during the first two octants, low during the next four and high during the last two of a shaft angle cycle. As a result, the output of amplifier 22c is equal to the output of filter 20 for the first two octants, equal to the inverse of the output of filter 20 for the next four, and to the output of filter 20 for the last two, and has the waveform illustrated at I in FIG. 3b. Amplifiers 22a and 22c use precision, matched resistor R in the shown configuration. Now that the absolute values of the two outputs of resolver 14 are available, they are compared at comparator 20c to determine the third bit of the octant. As a result, the output of comparator 20c is high (logical one) in the first, fourth, fifth and eighth octant of the shaft angle cycle, and low (logical zero) for the others, and can therefore serve as the third bit of the 3-bit octant identifier.

The absolute values available at the outputs of operational amplifiers 22a and 22c are supplied to a selector comprising, in the exemplary embodiment, CMOS transmission gates 24a and 24b controlled by the output of comparator 20c. Switch 24a is controlled by comparator 20c to connect to its output, in any given octant of the shaft angle cycle, the input which has the higher absolute value, and has the waveform illustrated at J in FIG. 3b. Conversely, switch 24b is controlled to connect to its output in any given octant the input which has the lower absolute value, and has the waveform illustrated at K in FIG. 3b. The higher absolute value at the output of switch 24a passes through a buffer 24c and precision resistor R1, and is supplied as the reference voltage to multiplying digital-to-analog converter 26 whose other input is an 8-bit word from microcomputer 10. The output of converter 26 is an analog signal determined by multiplying the 8-bit word supplied to converter 10 with the reference voltage supplied to it. The purpose is to find the 8-bit word which, when used in this multiplication, will make the output of converter 26 as close as possible to the output of switch 24b (which is first passed through a buffer 24d and matched precision resistor R1). To this end, the two feed the positive input of a comparator 28 whose negative input is grounded, and the output of comparator 28 is supplied to microcomputer 10. Thus, a successive approximations conversion can be carried out in which, e.g., the most significant bit of the word supplied to converter 26 is set to one, while all others are set to zero, to determine if the output of comparator 28 will indicate, by being high or low, if the shaft angle is in the first or second half of the octant indicated at the time by the 3-bit octant designator. If the logic is such that one designates first half, then the most significant bit is left at one, and the second most significant bit of the 8-bit word is set to one, to determine in a similar manner whether the shaft angle is in the first or second half of the octant half designated by the most significant bit, and so on until all 8 bits have been so set. As earlier noted, a full conversion cycle of converter 26 is short as compared to the cycle of the reference signal exciting the resolver rotor winding, e.g. 32 microseconds as compared to the 250 microsecond cycle of that reference signal, and the phase relationship between that reference voltage and the conversion cycle is such that the 32 microsecond cycle occur just before the peak of the positive half cycle of that reference voltage plus whatever time shifts have occurred due to the circuitry between the resolver rotor winding and the inputs to converter 26.

For conciseness and clarity, some conventional circuit elements have been omitted from the diagrams of FIGS. 1 and 2, such as Zener diodes used for protection, power supply elements, etc. While it is possible to use different components, and the invention certainly is not limited to the particular choice of components, exemplary items used are: resolver 11 BRCX-300-A-1B made by Harrowe-Bowmar Servo-Controls, transmission gates 16a–d, 22b and 22d and 24a and 24b can be Motorola CD4053BCN, low pass filters 18 and 19, operational amplifiers 22a and 22c and buffers 24c and 24d can use National LF442N, comparators 16e and 20a–c can be National LM339N and comparator 28 can be National LM311N, waveform shaper 12 can use Fairchild mA759U1C, converter 26 can be National DAC0800LCN, and microcomputer 10 can be Intel P8031. Logic converter 22 and look-up table 30 can utilize conventional, suitably loaded, EPROM devices, or the internal memory of microcomputer 10. In a preferred embodiment, each of the several comparators is connected in the opposite configuration; however, as this only changes the choice of high or low voltage for a logical one, it is a matter of engineering choice, and does not affect the substance of this disclosure.

Figure 4:
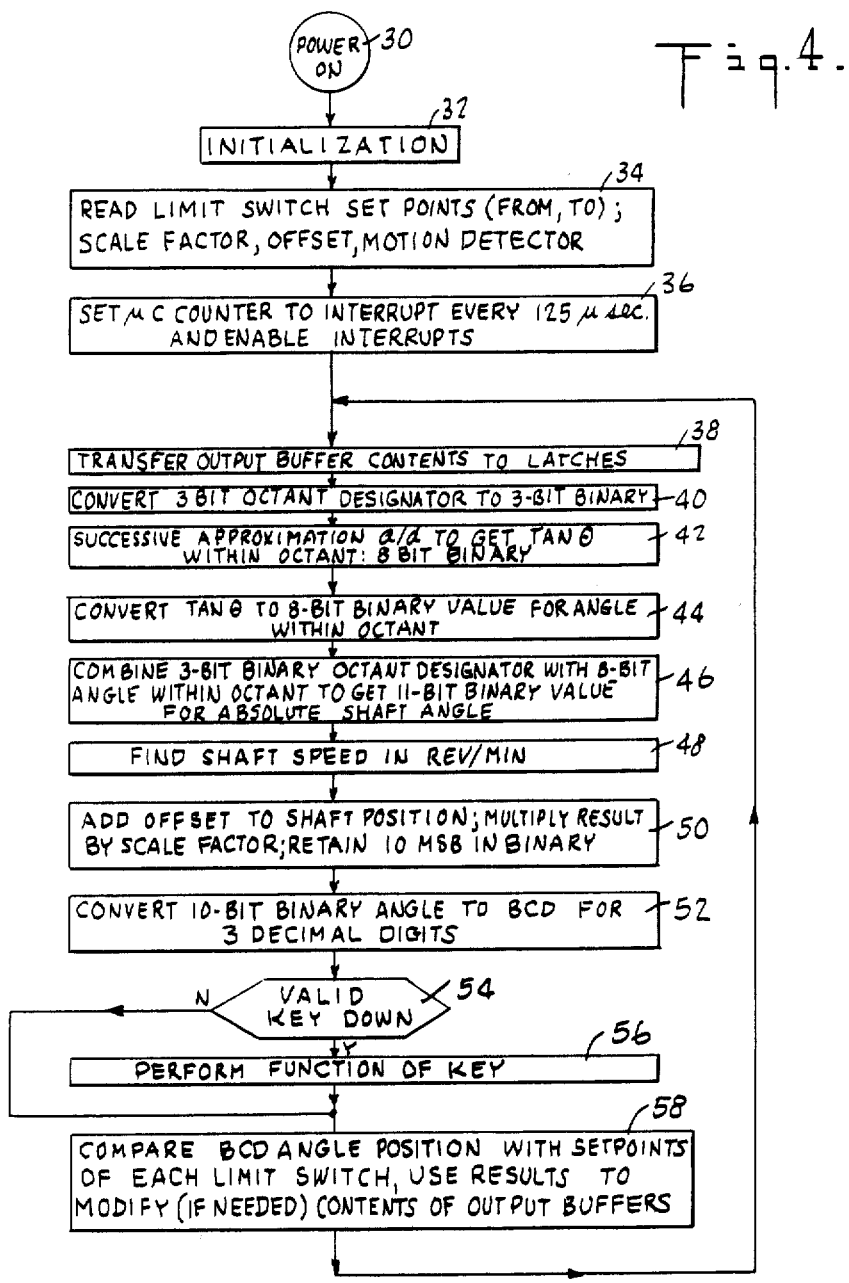
FIG. 4 is a flowchart illustrating the operation of a programmable limit switch system using the resolver-to-digital converter illustrated in FIGS. 1 and 2.

As earlier noted, the operation of the resolver-to-digital angle converter is a part of the operation of a programmable limit switch system. Referring to FIG. 4 for a description of the overall sequence of major steps of the system, once power is on at step 30 and some conventional housekeeping initialization has taken place at step 32, the system goes on to step 34 in which it reads the status of certain setpoints from a memory which is a part of or connected to microcomputer 10. Specifically, at step 34 the system reads from memory, such as an EAROM (EEROM) memory, the limit switch set points "from" and "to," the scale factor and the offset for each of a selected number of channels, e.g., 16. If one of the channels is designated for motion detection, the system reads the setting for that channel. For a given switch the "from" point is the shaft angle at which the switch is to be activated and the "to" point is the shaft angle at which the switch is to be deactivated. The "scale factor" is the value by which the output of look-up table 30 (FIG. 1) should be scaled so as to produce an angle measurement in a chosen scale, and the "offset" is a value by which the angle measurement at the output of look-up table 30 should be offset from an electrical zero point of the resolver. The motion detector setting differs from a from and to setting for a limit switch in that it is used to detect if the shaft is moving rather than to detect whether the shaft has moved from or to a particular angle. At step 36 the system sets the timer counter of microcomputer 10 to interrupt every 125 microseconds and enable the interrupts. At step 38 the system transfers to output latches the current contents of output buffers which contain digital code signals indicating whether the limit switches of interest should be activated or deactivated. At step 40 the system reads and converts to straight binary code the 3-bit output of octant selector 20 (FIG. 1), e.g., by operating logic converter 29 (FIG. 1) or carrying out an equivalent operation elsewhere, and at step 42 carries out the successive approximation analog conversion which involves converter 26 (FIG. 1). At step 44 the system uses look-up table 30 (FIG. 1) to convert the 8-bit word resulting from step 42 (which is indicative of the tangent of the shaft angle) to a binary code measurement of the angle, and at step 46 combines the 3-bit octant value produced as a result of step 40 with the 8-bit binary angle measurement resulting from step 40. The result is an 11-bit signal in pure binary code which indicates the absolute position of the shaft. At step 50 the system calculates the angular speed of the shaft in revolutions per minute, e.g., by timing changes in the fifth most significant bit of the 11-bit shaft position signal, and at step 50 adds any offset read in step 34 to the shaft position and multiplies the result by any scale factor from step 34 and retains the ten most significant bits. At step 52 the system converts the scaled and offset shaft angle position to a 3-digit BCD representation. At step 54, it checks if a valid key has been pushed down by an operator, and at step 56 performs the function of the key. As steps 54 and 56 are known in the art, they need not be described in detail. Once it is found that there is no valid key down, the system goes to step 58, where it compares the current scale and offset BCD angle position measurement with the from and to set points of every limit switch (which are also in BCD code) and the results of this comparison are used to modify, if needed, the contents of the output buffers referred to earlier in connection with step 38. The contents of these output buffers determine the control signals provided by the system to the respective limit switch channels. The system then returns to step 38, and this operation continues for as long as the system is in a run mode and the power is on.

Figure 5:
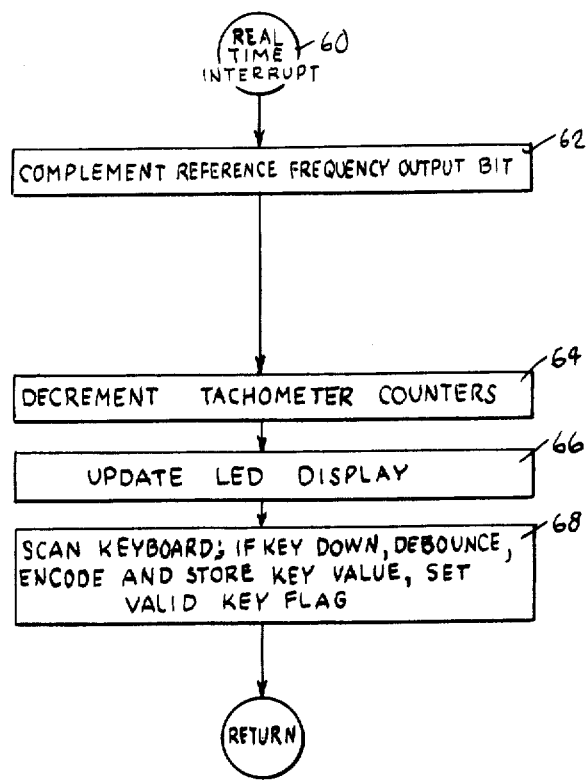
FIG. 5 is a flowchart of steps taken at a microcomputer interrupt.

Referring to FIG. 5, when as a result of the operation identified above in connection with step 36 in FIG. 4 an interrupt occurs at step 60, at step 62 the system complements a 1-bit reference frequency output, which is the bit whose status change produces the squarewave input to waveform shaper 12 (FIG. 1). At step 64, the system decrements any tachometer counters the system may use. At step 66 the system updates displays on the basis of the current states of output buffers, and at step 68 scans the keyboard to detect if a key is down and to debounce the key and encode and store its value and then set a valid key flag, whereupon it returns to whatever the system was doing before the interrupt. The interrupt referred to in connection with FIG. 5 is a highest priority interrupt so as to ensure that it occurs every 125 microseconds.

The steps referred to above are timed in relation to the interrupts and each other, through suitable programming of microcomputer 10, such that the successive approximation a/d step 42 would occur at the correct relationship to the peak of the positive sine wave of the resolver reference voltage, e.g., just before that peak. For example, an internal microcomputer counter can be used to start counting at the change of the reference bit status and to enable the successive approximation conversion at a time segment which is delayed relative to the change of the status bit by an amount of time placing it just before the peak of the reference voltage positive sine wave (after time shifts due to the circuitry between the resolver and the multiplying digital-to-analog converter 26 are taken into account). In the above description of FIGS. 4 and 5, the term system is used to refer to microcomputer 10 and its supporting elements (e.g., memories), as programmed through conventional techniques to carry out the inventive combination of steps described above—to carry out equivalent functions in some other way, such as by partly or fully firm-wired or hard-wired circuits.

Figure 3B:
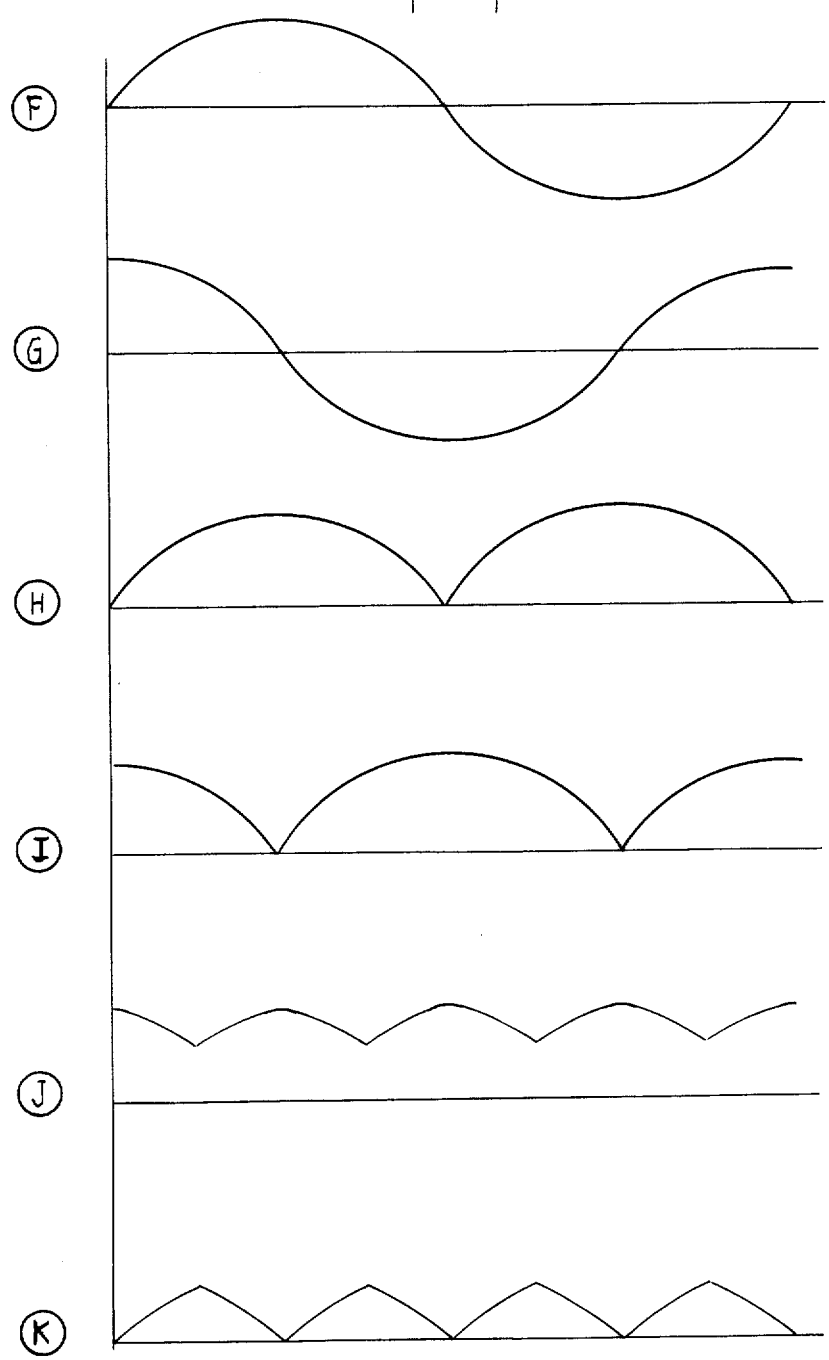

Of course, many variations are possible within the scope of the invention. As some nonlimiting examples: the squarewave from microcomputer 10 can be generated by means other than interrupts changing the status of a reference bit, the successive approximation analog-to-digital conversion can be replaced by another type of a/d conversion, the 32 microsecond conversion cycle can take place not at every positive half of the reference voltage sine wave as is described above, but once for every several such half cycles (indeed, in a preferred embodiment, there is only one 32 microsecond conversion cycle every 750 microseconds). It is to be understood, therefore, that the scope of the invention is not limited to the particular embodiment discussed above, or to any particular variations referred to above, but is limited only by the appended claims. In addition, it should be understood that the waveforms in FIGS. 3a and 3b are not to scale, and are only illustrative of the principles which are involved. For example, typically many more cycles of the reference voltage would occur per revolution of the resolver shaft than is illustrated in those figures.

I claim:

1. A resolver-to-digital angle converter comprising:
a microcomputer programmed to generate periodic highest priority interrupts and to complement an output bit at every interrupt and thereby generate a programmed square wave output;
a waveform shaper which comprises a bandpass filter and is driven by the status of said output bit to produce a substantially sinusoidal reference voltage signal at a frequency determined by the programmed interrupts of said microcomputer;
a resolver transducer having a rotor winding excited with said reference voltage signal and a pair of stator windings producing, in response, a pair of two-wire outputs which are at the frequency of the reference voltage but are amplitude-modulated as respective functions of the sine and cosine of the spatial angle between the resolver rotor and stator windings;
a synchronous detector comprising a comparator timed to the output of the waveform shaper to produce switch-control signals and analog CMOS switches timed by said switch control signals and receiving the resolver outputs and fullwave rectifying them to respective polarities determined by their sine and cosine amplitude modulation to thereby produce a fullwave rectified sine detector output and a fullwave rectified cosine detector output;
a sine active low pass filter and a cosine active low pass filter receiving the respective sine and cosine detector outputs and providing their respective sine and cosine envelopes as outputs;
an absolute value circuit receiving the sine envelope and providing the absolute value thereof and comprising a comparator receiving the output of the sine filter and providing an output which is high for the first four octants and low for the last four octants of the sine filter output, an analog CMOS switch controlled by the output of the comparator, and an operational amplifier having a positive input receiving the output of the last-recited switch and a negative input receiving the output of the sine filter and providing said absolute value at its output, and a corresponding absolute value circuit receiving the cosine envelope and providing the absolute value thereof;
an octant selector receiving the sine and cosine envelopes and comparing each to zero, and receiving the absolute values of the same envelopes and comparing them with each other, to provide three most significant bit outputs, the first determined by the polarity of the sine envelope, the second by the polarity of the cosine envelope and the third determined by the absolute value comparison;
a selector circuit receiving said absolute values of said envelopes and the third most significant bit to provide, for any given octant, a first output which is the greater of the two absolute value envelopes and a second output which is the lesser one;
means driven by said microcomputer and synchronized to said interrupts, for performing successive approximation analog-to-digital conversion of the selector circuit outputs and for providing a binary code output representative of the tangent of the shaft angle within a given octant;
means for combining said three most significant bits with said binary code output to provide a binary code representation of the shaft angle; and
means for utilizing said shaft angle.

2. A converter as in claim 1, and limit switch circuits responsive to said angle representation to selectively activate or deactivate limit switch control signals depending on the shaft angle.

3. A system as in claim 1 or 2 in which the combining means comprise a logic converter receiving said three most significant bits and converting them to three bits in pure binary code representing the octant of the shaft angle, and a look-up table circuit receiving the three bits in pure binary code and the binary code output of the analog-to-digital conversion and providing an averaged output for the absolute shaft angle.

4. A method comprising:
programming a microcomputer to change the status of an output bit at a predetermined frequency to thereby generate a square wave, and using said bit status changes in the form of a square wave to generate a substantially sinusoidal reference a-c voltage;
applying the reference a-c voltage to a resolver which has two stator windings and is responsive to the reference voltage to provide an output related to the sine of a shaft angle and an output related to the cosine of the angle;
converting the resolver outputs to a digital shaft angle measurement, said conversion taking place within a conversion cycle which is short as compared to the time between changes in the state of the output bit and which is programmably timed by the microcomputer to occur in a selected time relationship to the peaks of the reference a-c voltage;
selectively offsetting and/or scaling the digital shaft angle measurement and testing the result against the setpoints of each of a number of limit switch channels, and providing limit switch control signals as a result of said testing;
wherein the converting step comprises fullwave rectifying the sine output of the resolver and the cosine output of the resolver by supplying the resolver outputs to analog CMOS switches timed by a comparator which in turn is timed by a waveform-shaped version of said square wave, filtering the fullwave rectified sine output of the resolver through an active sine lowpass filter and filtering the fullwave rectified cosine output of the resolver through an active cosine lowpass filter, to provide the respective sine and cosine envelopes as outputs, providing the absolute value of the sine envelope by using a comparator receiving the sine filter output and providing an output which is high for the first fout octants and low for the last four octants of the sinusoidal reference voltage, controlling an analog CMOS switch with the comparator output and feeding the switch output to the positive input of an operational amplifier and feeding the output of the comparator to the negative input of the same operational amplifier to thereby privide said absolute value of the sine envelope at the operational amplifier's output, and providing the absolute value of the cosine envelope by using a corresponding circuit including a comparator, analog CMOS switch and operational amplifier, using the sine and cosine envelopes to provide three most significant bit outputs, the first determined by the polarity of the sine envelope, the second by the polarity of the cosine envelope and the third by a comparison of the absolute values of the sine and cosine envelopes, using said absolute values and said third most significant bit to produce a binary code output indicative of the octant of the shaft angle and combining said binary code output with said three most significant bits to provide said digital shaft angle measurement.

* * * * *